(12) United States Patent
Wang

(10) Patent No.: US 9,508,814 B2
(45) Date of Patent: Nov. 29, 2016

(54) INTEGRATED CIRCUIT HAVING A CONTACT ETCH STOP LAYER

(71) Applicant: TAIWAN SEMICONDUCTOR MANUFACTURING COMPANY, LTD., Hsinchu (TW)

(72) Inventor: Shiang-Bau Wang, Pingzchen (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/837,112

(22) Filed: Aug. 27, 2015

(65) Prior Publication Data

US 2015/0364559 A1    Dec. 17, 2015

Related U.S. Application Data

(62) Division of application No. 13/278,569, filed on Oct. 21, 2011, now Pat. No. 9,142,462.

(60) Provisional application No. 61/405,448, filed on Oct. 21, 2010.

(51) Int. Cl.
| | |
|---|---|
| H01L 21/28 | (2006.01) |
| H01L 29/423 | (2006.01) |
| H01L 21/768 | (2006.01) |
| H01L 29/66 | (2006.01) |
| H01L 29/78 | (2006.01) |
| H01L 23/528 | (2006.01) |
| H01L 29/06 | (2006.01) |
| H01L 29/49 | (2006.01) |
| H01L 29/51 | (2006.01) |
| H01L 21/8234 | (2006.01) |

(52) U.S. Cl.
CPC ... *H01L 29/42368* (2013.01); *H01L 21/76834* (2013.01); *H01L 21/823475* (2013.01); *H01L 23/528* (2013.01); *H01L 29/0653* (2013.01); *H01L 29/4916* (2013.01); *H01L 29/51* (2013.01); *H01L 29/513* (2013.01); *H01L 29/518* (2013.01); *H01L 29/6659* (2013.01); *H01L 29/66545* (2013.01); *H01L 29/78* (2013.01); *H01L 29/7833* (2013.01); *H01L 21/823468* (2013.01); *H01L 2924/0002* (2013.01)

(58) Field of Classification Search
CPC ...... H01L 29/78; H01L 21/336; H01L 21/28
See application file for complete search history.

(56) References Cited

U.S. PATENT DOCUMENTS

| | | | |
|---|---|---|---|
| 6,693,038 B1 | 2/2004 | Shen | |
| 7,968,422 B2 | 6/2011 | Hautala | |
| 7,977,255 B1 | 7/2011 | Scheer et al. | |
| 2006/0189053 A1 | 8/2006 | Wang et al. | |
| 2008/0093682 A1* | 4/2008 | Yao | H01L 21/28097 257/413 |
| 2009/0032881 A1* | 2/2009 | Lee | H01L 21/82380 257/369 |
| 2009/0104741 A1* | 4/2009 | Shin | H01L 21/28176 438/229 |
| 2009/0317564 A1 | 12/2009 | Hautala et al. | |
| 2010/0200946 A1 | 8/2010 | Hautala | |
| 2010/0244141 A1 | 9/2010 | Beyer et al. | |
| 2010/0314690 A1 | 12/2010 | Chung et al. | |
| 2011/0003471 A1 | 1/2011 | King et al. | |
| 2011/0217847 A1 | 9/2011 | Tamura | |
| 2011/0241119 A1 | 10/2011 | Chen et al. | |

\* cited by examiner

*Primary Examiner* — Whitney T Moore
*Assistant Examiner* — Joseph Galvin, III
(74) *Attorney, Agent, or Firm* — Hauptman Ham, LLP

(57) ABSTRACT

An integrated circuit structure includes a gate stack over a substrate. The integrated circuit structure also includes a gate spacer over a sidewall of the gate stack. The integrated circuit structure further includes a contact etch stop layer (CESL) having a bottom portion over the substrate and a sidewall portion over a sidewall of the gate spacer. The sidewall portion has a first thickness less than a second thickness of the bottom portion.

20 Claims, 7 Drawing Sheets

INTEGRATED CIRCUIT HAVING A CONTACT ETCH STOP LAYER

PRIORITY CLAIM

The present application is a divisional of U.S. application Ser. No. 13/278,569, filed Oct. 21, 2011, which claims priority of U.S. Provisional Application No. 61/405,448, filed Oct. 21, 2010, which are incorporated herein by reference in their entireties.

RELATED APPLICATIONS

The present disclosure is related to the following commonly-assigned U.S. patent applications, the entire disclosures of which are incorporated herein by reference: U.S. application Ser. No. 12/750,485 for "Sidewall-Free CESL for Enlarging ILD Gap-Fill Window".

TECHNICAL FIELD

This disclosure relates generally to integrated circuits, and more particularly to the gap-filling of inter-layer dielectrics (ILDs) during the manufacture of integrated circuits.

BACKGROUND

Replacement gates are widely used in the manufacturing of integrated circuits. In the formation of replacement gates, polysilicon gates are formed first, and replaced by metal gates in subsequent process steps. With the using of replacement gates, the gates of P-type metal-oxide semiconductor (PMOS) and N-type metal-oxide semiconductor (NMOS) devices can have band-edge work functions, so that their performance can be optimized.

The replacement gates typically have great heights, and hence the aspect ratios of the gaps between gate stacks are also high. For example, FIG. 1 illustrates polysilicon gates 102 and 104 adjacent to each other. Gap 106 is thus formed between polysilicon gates 102 and 104. After the formation of polysilicon gates 102 and 104, a contact etch stop layer (CESL) 108 may be formed thereon. The formation of CESL 108 adversely results in an increase in the aspect ratio of gap 106.

Referring to FIG. 2, inter-layer dielectric (ILD) 110, often referred to as ILD0, is formed to fill gap 106. In subsequent process steps, polysilicon gates 102 and 104 may be replaced with metal gates. Currently, high-density plasma (HDP) processes are widely used for the ILD0 gap filling process. However, the gap filling capability of HDP is not satisfactory, and hence void 112 may be formed in gap 106. If formed using advanced technologies such as 22 nm or 20 nm technologies, the aspect ratio of gap 106 is particularly high, e.g., greater than 3.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF ILLUSTRATIVE EMBODIMENTS

Figure 1:
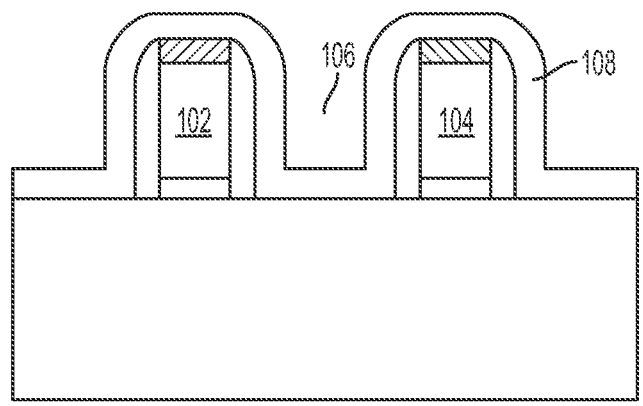
FIGS. 1 and 2 illustrate cross-sectional views of intermediate stages in a conventional manufacturing process of an integrated circuit structure.
Figure 2:
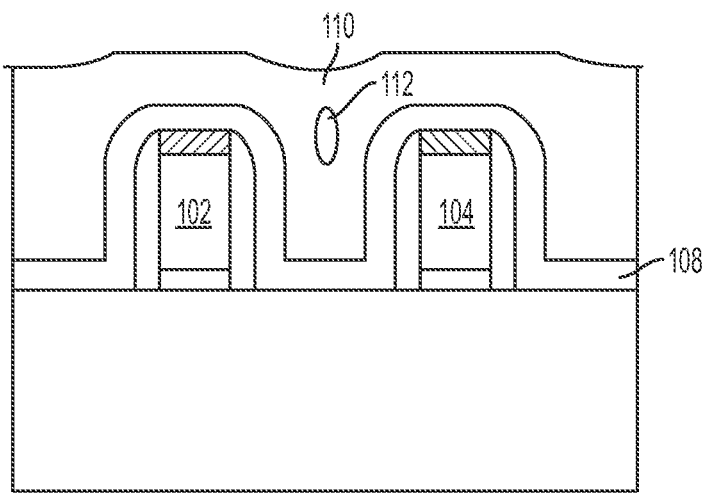

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 3 and 4A through 11, a method 100 and a semiconductor device 200 are collectively described below. The semiconductor device 200 illustrates an integrated circuit, or a portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 3:
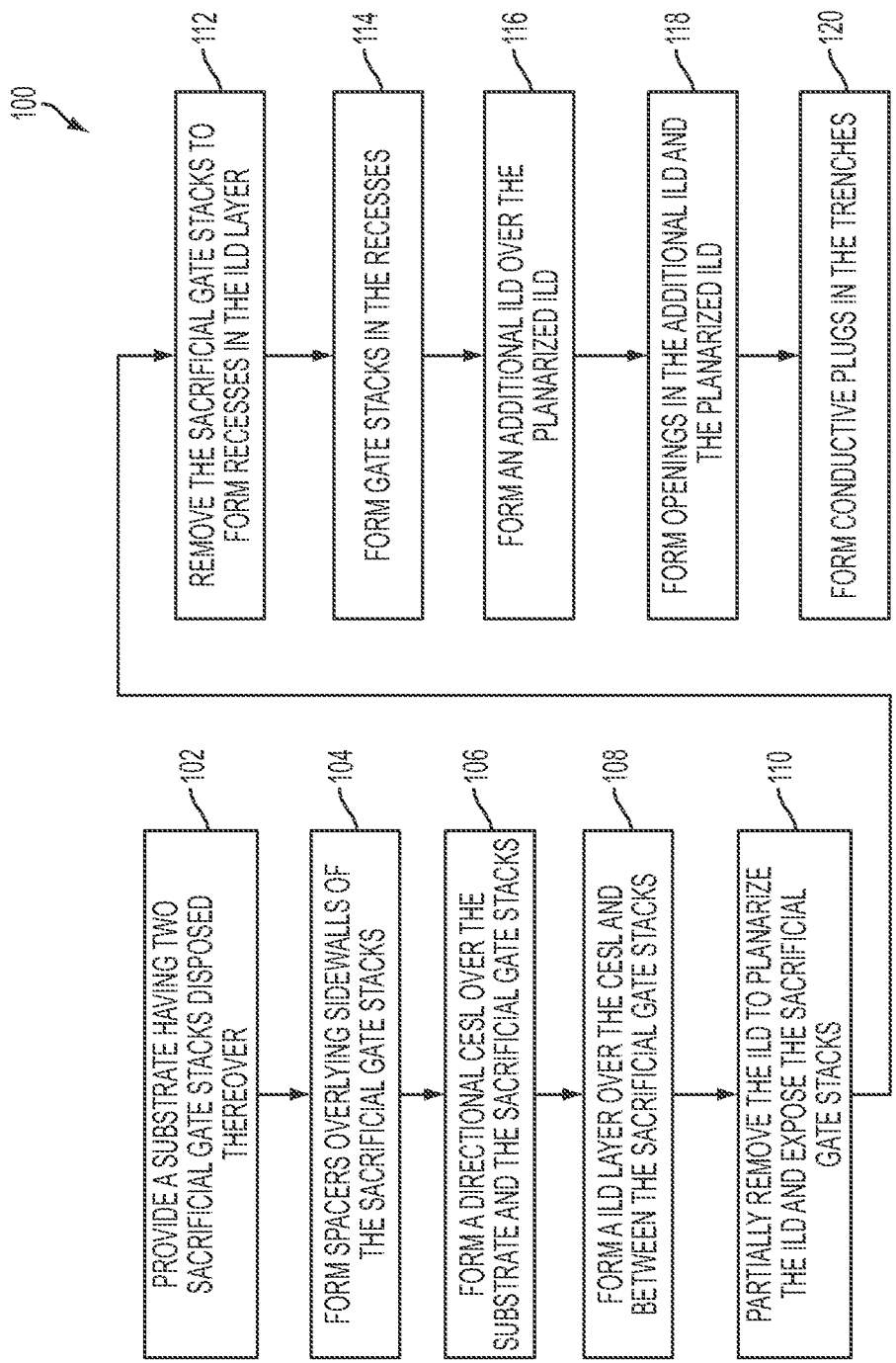
FIG. 3 is a flow chart of a method of fabricating an integrated circuit device according to an embodiment of the present disclosure.
Figure 4A:
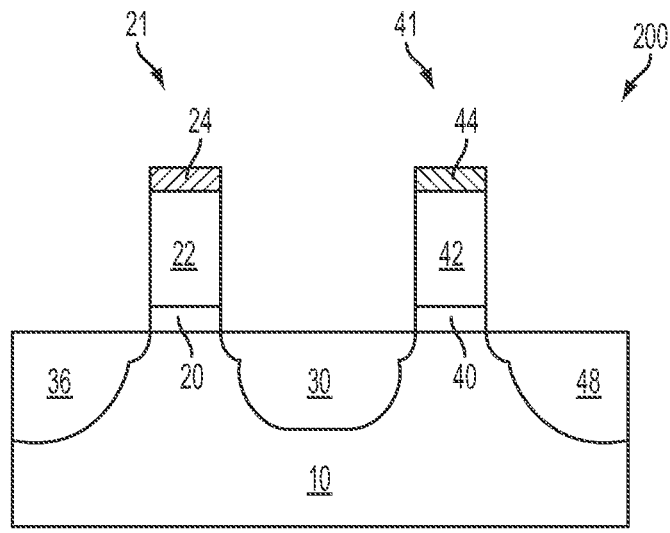
FIGS. 4A through 11 are various diagrammatic cross-sectional views and a top view of an integrated circuit device during various fabrication stages according to the method of FIG. 3.

Referring to FIGS. 3 and 4A, the method 100 begins at step 102 wherein a substrate 10 is provided. In the present embodiment, the substrate 10 is a semiconductor substrate comprising silicon. In some alternative embodiments, the substrate 10 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlinAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multi-layered compound semiconductor structure.

The substrate 10 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 10, in a P-well structure, in an N-well structure, in a dual-well structure, or a raised structure. The semiconductor device 200 may include a NFET device and/or a PFET device, and thus, the substrate 10 may include various doped regions configured for a particular device in each of the NFET device and/or the PFET device. A first gate stack 21 and a second gate stack 41 are formed over the substrate 10. The first gate stack 21 includes, in a bottom-up order, a gate dielectric 20, a gate electrode 22, and a hard mask 24. The second gate stack 41 includes, in a bottom-up order, a gate dielectric 40, a gate electrode 42, and a hard mask 44. The first and second gate stacks 21, 41 may be formed by deposition, lithography patterning, and/or etching processes.

The gate dielectrics 20, 40 are formed over the substrate 10 and include a dielectric material, such as silicon oxide, silicon oxynitride, silicon nitride, a high dielectric constant (high-k) dielectric material, other suitable dielectric material, or combinations thereof. Exemplary high-k dielectric materials include $HfO_2$, HfSiO, HfSiON, HfTaO, HfSiO, HfZrO, other suitable materials, or combinations thereof. The gate dielectrics 20, 40 may be a multi-layered structure, for example, including an interfacial layer, and a high-k dielectric material layer formed on the interfacial layer. An exemplary interfacial layer may be a grown silicon oxide layer formed by a thermal process or Atomic Layer Deposition (ALD) process.

The gate electrodes 22, 42 are formed over the gate dielectrics 20, 40, respectively. In some embodiments, the gate electrodes 22, 42 are formed using a polycrystalline silicon (polysilicon) layer. The polysilicon layer may be doped for proper conductivity. Alternatively, the polysilicon is not necessarily doped if the gate electrodes 22, 42 are sacrificial gates, which are to be replaced in a subsequent gate replacement process. In some alternative embodiments, the gate electrodes 22, 42 could include a conductive layer having a proper work function, therefore, the gate electrodes 22, 42 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate electrodes 22, 42 may include other conductive materials, such as aluminum, copper, tungsten, metal alloys, metal silicide, other suitable materials, or combinations thereof. For example, where the gate electrodes 22, 42 include a work function layer, another conductive layer can be formed over the work function layer.

The hard masks 24, 44 formed over the gate electrodes 22, 42 include silicon oxide, silicon nitride, silicon oxynitride, silicon carbide, other suitable dielectric material, or combinations thereof. In some embodiments, the hard masks 24, 44 may have a multi-layered structure.

In some embodiments, a common source or a common drain 30 (referred to as a source/drain hereinafter) may be located in substrate 10 and between the first and second gate stacks 21 and 41. Source/drain regions 36 and 48 may be formed adjacent to the first and second gate stacks 21 and 41, respectively. The first gate stack 21 and source/drain regions 30 and 36 form a first MOS device, and the second gate stack 41 and source/drain regions 30 and 48 form a second MOS device.

Figure 4B:
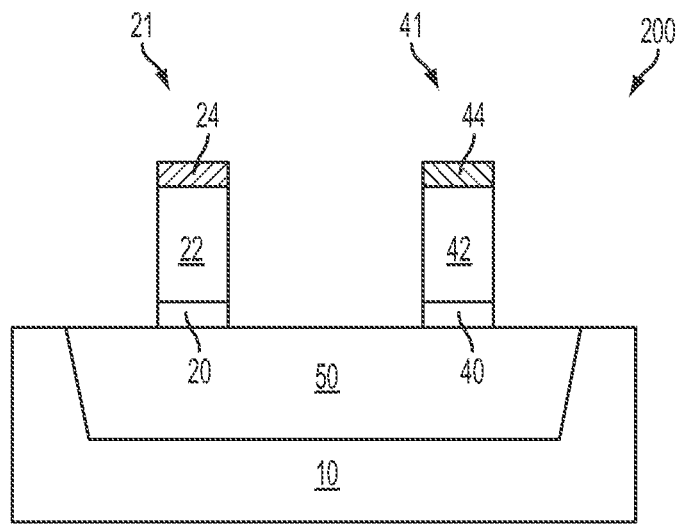

FIG. 4B illustrates a semiconductor device according to another embodiment, wherein the gate electrodes 22, 42 are formed over a shallow trench isolation (STI) structure 50. The STI structure 50 comprises silicon oxide, silicon nitride, silicon oxynitride, other suitable materials, or combinations thereof. As one example, forming the STI structure 50 includes an etching process to form a trench in the substrate 10, and filling the trench with one or more dielectric materials. In some examples, the filled trench may have a multi-layered structure, such as a thermal oxide liner layer filled with silicon nitride or silicon oxide. Also, the structure shown in FIG. 4B may be an extension portion of the structure shown in FIG. 4A.

Figure 5:
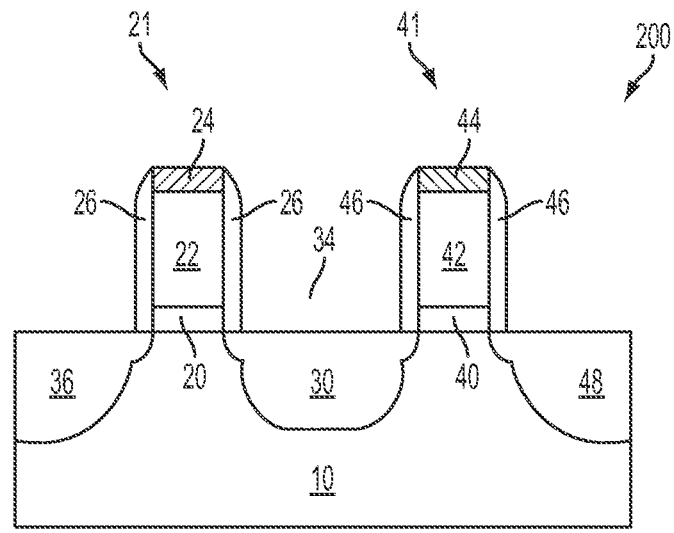
Figure 5A:
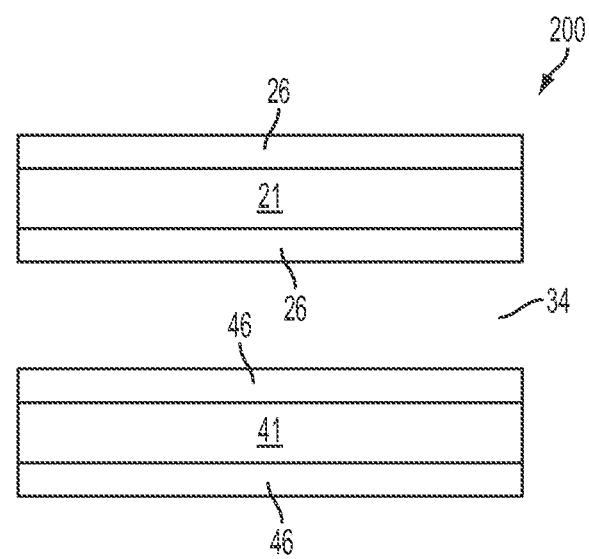

Referring to FIGS. 3 and 5, the method 100 continues with step 104 in which gate spacers 26, 46 are formed for the first and second gate stacks 21, 41, respectively. The gate spacers 26 and 46 are adjacent to each other with a gap 34 therebetween. In at least one embodiment, gate spacers 26, 46 are formed overlying sidewalls of the gate stacks 21, 41 by a suitable process. For example, a dielectric layer, such as a silicon nitride layer, is blanket deposited over the first and second gate stacks 21, 41 and the substrate 10; and then, portions of the dielectric layer are removed by a dry etching process to form the gate spacers 26, 46. The gate spacers 26, 46 are in contact with the sidewalls of the first and second gate stacks 21, 41. In some alternative embodiments, the spacers 26, 46 have a multi-layered structure including another dielectric material, such as silicon oxide, silicon oxynitride, or combinations thereof. In another embodiment, liners (not shown) are formed between the gate spacers 26, 46 and the first and second gate stacks 21, 41 by a suitable process. The liners may also comprise another suitable dielectric material. A top view of the structure shown in FIG. 5 is illustrated in FIG. 5A.

Figure 6:
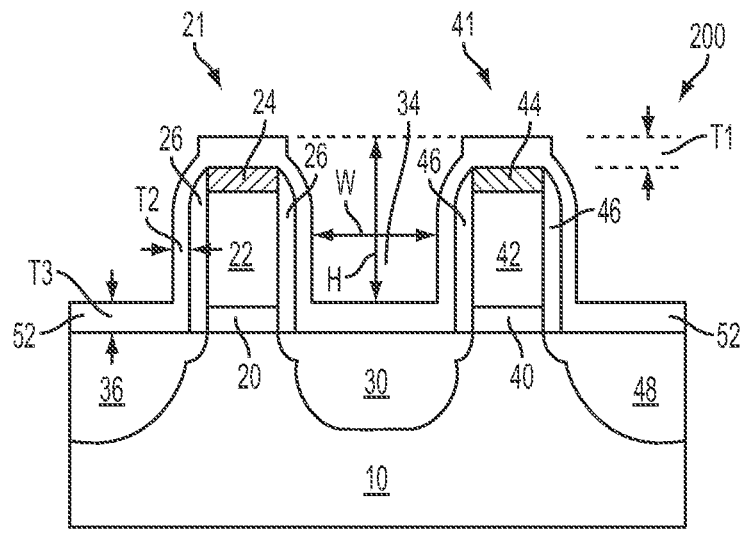

Referring to FIGS. 3 and 6, the method 100 continues with step 106 in which a contact etch stop layer (CESL) 52 is formed using a directional deposition. The directional deposition may form the CESL 52 having different thicknesses within different portions caused by the topography under the CESL 52. For example, the CESL 52 formed over the first and second gate stacks 21, 41, the gate spacers 26, 46, and the substrate 10, and includes top portions located on the top of the hard mask 24, 44, bottom portions at bottom of the gap 34, and sidewall portions located on sidewalls of the gate spacers 26, 46 and between the top and bottom portions. The top, sidewall, and bottom portions have a first thickness T1, a second thickness T2, and a third thickness T3, respectively. In at least one embodiment, the first thickness T1 may be the same as or thicker than the third thickness T3. In another embodiment, the second thickness T2 is less than the first thickness T1 or the third thickness T3. In another embodiment, a ratio of the second thickness T2 to the first thickness T1 or to the third thickness T3 is less than about ½. The CESL 52 includes, but is not limited to, materials $SiN_x$, $SiO_x$, SiON, SiC, SiCN, BN, SiBN, SiCBN, or combinations thereof.

In at least one embodiment, the directional deposition is performed using cluster ion beams (GCIBs) deposition. GCIBs are cluster ion beams and can be used to deposit film. In some embodiments, the gas clusters are nano-sized aggregates of materials that are gaseous under a temperature ranging from about −20° C. to about 100° C. and a pressure ranging from 1E-7 torr to about 1E-4 torr in a process chamber. When a gaseous material(s) is released into a vacuum chamber as a jet, the jet is inherently cooled as static enthalpy is exchanged for kinetic energy. The cooling results from expansion of the jet in the vacuum. A portion of the jet is rapidly cooled and condensed to form gas clusters. The gas clusters can be ionized by electron bombardment, which permits the gas clusters to be formed into directed beams of controllable energy. The ionized gas clusters can also be accelerated to attain a desired kinetic energy. The larger sized cluster ions are useful for forming a directional film. The CESL 52, for example, is formed by the GCIBs deposition with Si-containing gas (e.g., $SiH_4$) and N-containing gas (e.g., $N_2$) under an acceleration voltage ranging from about 1 kilovolts (kV) to about 100 kV.

In another embodiment, the directional deposition is performed using physical vapor deposition (PVD). For example, during a reactive PVD process, portions of Si target are sputtered away by an ion bombardment process; then the sputtered Si reacts with N-containing (e.g., $N_2$) plasma to form the CESL 52. The N-containing (e.g., $N_2$) plasma may further include Ar plasma.

Figure 7:
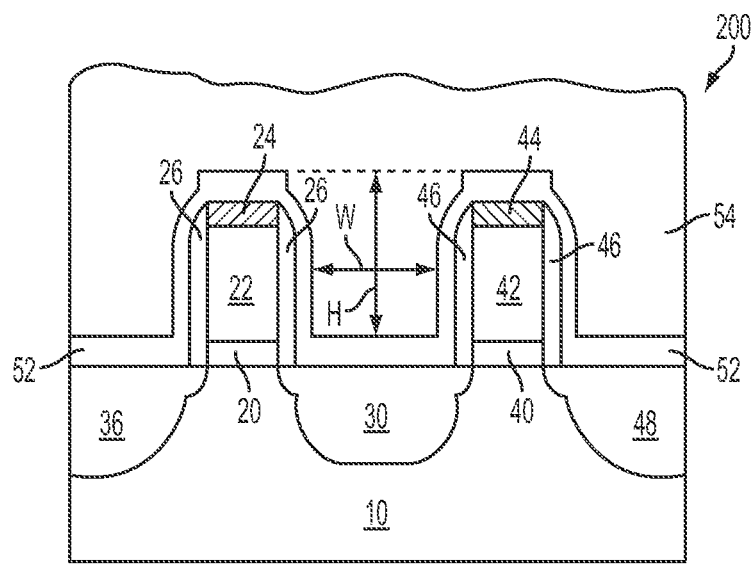

As a result of forming the CESL 52 with thinner sidewall portions, aspect ratio (the ratio of height H to width W) of the gap 34 is reduced, and hence the possibility of forming voids in the subsequent gap-filling process is reduced. Referring to FIGS. 3 and 7, the method 100 continues with step 108 in which an inter-layer dielectric (ILD) 54 is formed over the CESL 52 to fill the gap 34. The ILD 54 may use a dielectric material the same or different from the CESL 52, including, but not limited to, $SiN_x$, $SiO_x$, SiON, SiC, SiBN, SiCBN, or combinations thereof. In at least one embodiment, the ILD 54 is formed using HDP, although other methods such as Sub-Atmospheric Pressure Chemical Vapor Deposition (SACVD), Lower Pressure Chemical Vapor Deposition (LPCVD), ALD, Plasma enhanced ALD (PEALD), Plasma enhanced CVD (PECVD), Monolayer Deposition (MLD), Plasma Impulse CVD (PICVD), spin-on, or the like may also be used.

Figure 8:
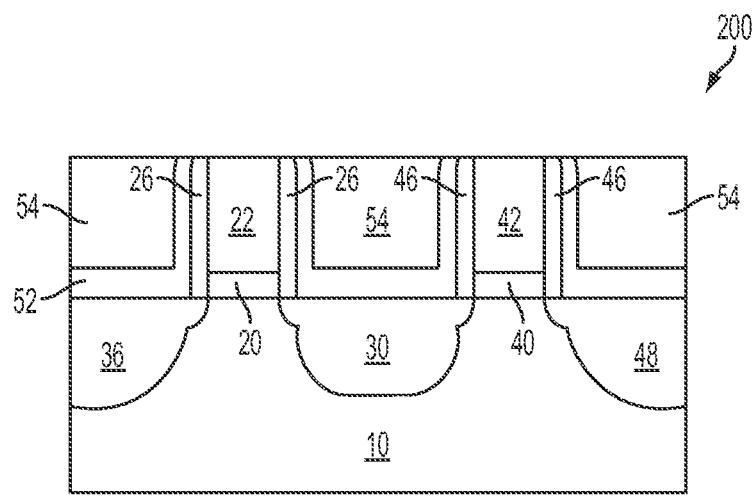

Referring to FIGS. 3 and 8, the method 100 continues with step 110 in which a planarizing process is performed to partially remove the ILD 54 and the top portion of CESL 52 to expose the hard masks 24, 44. The planarizing process is, for example, a chemical mechanical polish (CMP) process. Thereafter, the hard masks 24, 44 may be removed by the planarizing process or another etching and/or CMP process to expose the underlying gate electrodes 22, 42.

Figure 9:
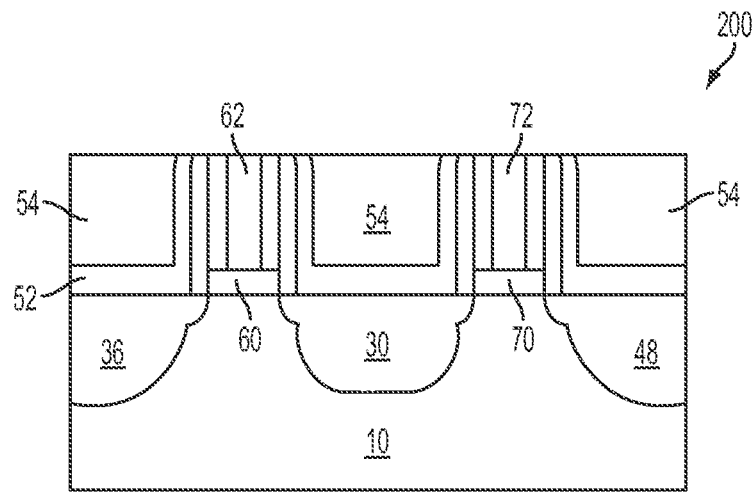

Next, referring to FIGS. 3 and 9, the method 100 continues with steps 112 and 114 in which the gate electrodes 22, 42 and the gate dielectrics 20, 40 are removed by a commonly used etching process and replaced by gate dielectrics 60 and 70 and metal gates 62 and 72 with proper work functions. In an alternative embodiment, the gate electrodes 22, 42 are removed, leaving the gate dielectrics 20, 40, and replaced by metal gates 62 and 72 with proper work functions. The formation processes are known in the art, and hence are not repeated herein. As a result, the first and second gate stacks shown in FIG. 4A will also be replaced by gate dielectrics 60, 70 and metal gates 62, 72.

Figure 10:
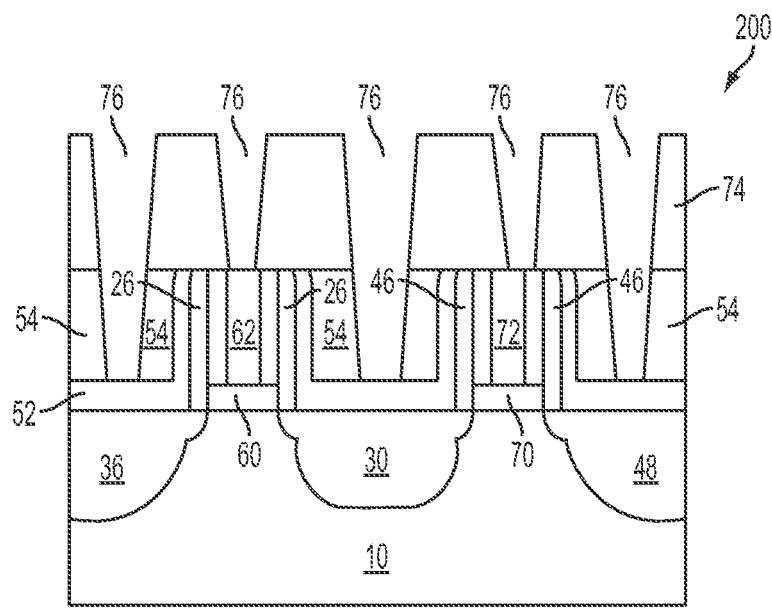

Referring to FIGS. 3 and 10, the method 100 continues with steps 116 and 118 in which an additional ILD 74, often referred to as ILD1, is formed over the planarized ILD 60 and the metal gates 62 and 72. The process is then continued by forming contact openings 76 in the additional ILD 74 and/or the planarized ILD 60 by a commonly used etching process. In the formation of the contact openings, the top or bottom portions of the CESL 52 may be function as stoppers during the etching process.

Figure 11:
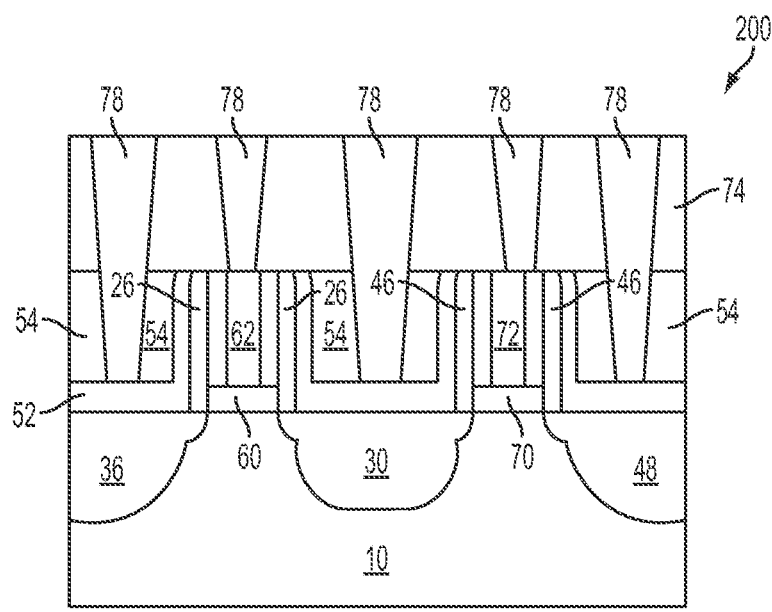

Referring to FIGS. 3 and 11, the method 100 continues with step 120 in which conductive contact plugs 78 are formed to fill the contact openings 76.

The embodiments of the present invention have several advantageous features. By forming the CESL 52 with thinner sidewall portions, the aspect ratios of the gaps between adjoining gate spacers are reduced. Therefore, voids are less likely to be incurred during the gap filling process. This is particularly beneficial for MOS devices formed using the gate-last approach due to the relatively great height of the gate stacks.

An aspect of this description is related to an integrated circuit structure. The integrated circuit structure comprises a gate stack over a substrate. The integrated circuit structure also comprises a gate spacer over a sidewall of the gate stack. The integrated circuit structure further comprises a contact etch stop layer (CESL) comprising a bottom portion over the substrate and a sidewall portion over a sidewall of the gate spacer. The sidewall portion has a first thickness less than a second thickness of the bottom portion.

Another aspect of this description is related to an integrated circuit structure. The integrated circuit structure comprises a gate stack comprising a gate electrode and a gate dielectric. The gate stack is over a substrate. The integrated circuit structure also comprises a gate spacer over a sidewall of the gate stack. The integrated circuit structure further comprises a contact etch stop layer (CESL) comprising a bottom portion over the substrate and a sidewall portion over a sidewall of the gate spacer. The sidewall portion has a first thickness less than a second thickness of the bottom portion.

A further aspect of this description is related to and integrated circuit structure. The integrated circuit structure comprises a first gate stack over a substrate. The integrated circuit structure also comprises a second gate stack over the substrate. The integrated circuit structure further comprises a first spacer over a sidewall of the first gate stack and a second spacer over a sidewall of the second gate stack. The integrated circuit structure additionally comprises a contact etch stop layer (CESL) comprising a bottom portion over the substrate between the first spacer and the second spacer, and a sidewall portion over a sidewall of the first spacer. The sidewall portion has a first thickness less than a second thickness of the bottom portion.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure, comprising:
   a gate stack over a substrate;
   a gate spacer over a sidewall of the gate stack; and
   a contact etch stop layer (CESL) comprising a bottom portion over the substrate and a sidewall portion over a sidewall of the gate spacer,
   wherein
   the sidewall portion has a first thickness less than a second thickness of the bottom portion, and
   a top surface of the gate stack is coplanar with a top surface of the CESL.

2. The integrated circuit structure of claim 1, wherein a ratio of the first thickness to the second thickness is less than about 1/2.

3. The integrated circuit structure of claim 1, further comprising:
   an inter-layer dielectric (ILD) layer over the CESL.

4. The integrated circuit structure of claim 1, wherein the CESL comprises one or more of $SiN_x$, $SiO_x$, SiON, SiC, SiCN, BN, SiBN or SiCBN.

5. The integrated circuit structure of claim 1, further comprising:
   a shallow trench isolation (STI) structure under the gate stack.

6. The integrated circuit structure of claim 1, further comprising:
   a source/drain region in the substrate.

7. The integrated circuit structure of claim 1, wherein the gate stack comprises a metal and polysilicon.

8. An integrated circuit structure, comprising:
   a gate stack comprising a gate electrode and a gate dielectric, the gate stack being over a substrate;
   a gate spacer over a sidewall of the gate stack; and
   a contact etch stop layer (CESL) comprising a bottom portion over the substrate and a sidewall portion over a sidewall of the gate spacer,
   wherein
   the sidewall portion has a first thickness less than a second thickness of the bottom portion, and
   a top surface of the gate electrode is coplanar with a top surface of the CESL.

9. The integrated circuit structure of claim 8, further comprising:
   an inter-layer dielectric (ILD) layer over the CESL.

10. The integrated circuit structure of claim 9, wherein the CESL comprises one or more of $SiN_x$, $SiO_x$, SiON, SiC, SiCN, BN, SiBN or SiCBN, and the ILD layer comprises one or more of $SiN_x$, $SiO_x$, SiON, SiC, SiCN, BN, SiBN or SiCBN.

11. The integrated circuit structure of claim 9, wherein the CESL and the ILD layer comprise a same material.

12. The integrated circuit structure of claim 9, wherein the CESL and the ILD comprise at least one different material.

13. The integrated circuit structure of claim 8, further comprising:
   a first source/drain region in the substrate on a first side of the gate stack; and
   a second source/drain region in the substrate on a second side of the gate stack opposite the first side of the gate stack.

14. The integrated circuit structure of claim 8, wherein the gate electrode comprises a metal over the gate dielectric.

15. An integrated circuit structure, comprising:
   a first gate stack over a substrate;
   a second gate stack over the substrate;
   a first spacer over a sidewall of the first gate stack and a second spacer over a sidewall of the second gate stack; and
   a contact etch stop layer (CESL) comprising a bottom portion over the substrate between the first spacer and the second spacer, and a sidewall portion over a sidewall of the first spacer,
   wherein
   the sidewall portion has a first thickness less than a second thickness of the bottom portion, and
   the CESL, the first gate stack, and the second gate stack comprise corresponding coplanar top surfaces.

16. The integrated circuit structure of claim 15, further comprising:
   a source/drain region beneath the bottom portion of the CESL, wherein the CESL is in contact with the source/drain region.

17. The integrated circuit structure of claim 15, wherein a ratio of the first thickness to the second thickness is less than about 1/2.

18. The integrated circuit structure of claim 15, further comprising:
   an inter-layer dielectric (ILD) layer over the CESL.

19. The integrated circuit structure of claim 18, further comprising:
   a contact plug in the ILD layer.

20. The integrated circuit structure of claim 18, wherein a top surface of the ILD layer is coplanar with the top surface of the CESL.

* * * * *